United States Patent
Zhang et al.

(10) Patent No.: US 10,604,857 B2
(45) Date of Patent: Mar. 31, 2020

(54) COPPER CRYSTAL PARTICLES HAVING A HIGHLY PREFERRED ORIENTATION AND A PREPARATION METHOD THEREOF

(71) Applicant: Suzhou Shinhao Materials LLC, Suzhou (CN)

(72) Inventors: Yun Zhang, Suzhou (CN); Jing Wang, Suzhou (CN); Zifang Zhu, Wujiang (CN); Tao Ma, Suzhou (CN); Luming Chen, Suzhou (CN)

(73) Assignee: Suzhou Shinhao Materials LLC, Wujiang (CN)

( * ) Notice: Subject to any disclaimer, the term of this patent is extended or adjusted under 35 U.S.C. 154(b) by 178 days.

(21) Appl. No.: 15/745,685

(22) PCT Filed: Sep. 26, 2017

(86) PCT No.: PCT/CN2017/103498
§ 371 (c)(1),
(2) Date: Jan. 17, 2018

(87) PCT Pub. No.: WO2018/095132
PCT Pub. Date: May 31, 2018

(65) Prior Publication Data
US 2019/0338432 A1    Nov. 7, 2019

(30) Foreign Application Priority Data

Nov. 23, 2016  (CN) .......................... 2016 1 1037367

(51) Int. Cl.
*C25D 15/00* (2006.01)
*C25D 3/38* (2006.01)
*B32B 15/01* (2006.01)
*C30B 28/04* (2006.01)
*C30B 29/02* (2006.01)

(52) U.S. Cl.
CPC ............... *C25D 3/38* (2013.01); *B32B 15/01* (2013.01); *C30B 28/04* (2013.01); *C30B 29/02* (2013.01)

(58) Field of Classification Search
CPC ...................................................... C25D 15/00
USPC ....................................................... 205/109
See application file for complete search history.

(56) References Cited

U.S. PATENT DOCUMENTS

| | | | |
|---|---|---|---|
| 2001/0015321 A1 | 8/2001 | Reid et al. | |
| 2003/0221966 A1 | 12/2003 | Bonkass et al. | |
| 2005/0014317 A1 | 1/2005 | Pyo | |
| 2010/0041230 A1* | 2/2010 | Witt | H01L 21/76877 438/660 |

(Continued)

FOREIGN PATENT DOCUMENTS

| CA | 2465363 A1 | 2/2004 |
|---|---|---|
| CN | 102953097 A | 4/2007 |

(Continued)

*Primary Examiner* — Edna Wong
(74) *Attorney, Agent, or Firm* — SZDC Law P.C.

(57) ABSTRACT

An electroplating copper layer includes bamboo-like copper crystal particles having a highly preferred orientation. The bamboo-like copper crystal particles have a long axis direction and a short axis direction, and the bamboo-like copper crystal particles have a length of 20 nm to 5 μm in the long axis direction and a length of 20 nm to 2 μm in the short axis direction. A method of preparing the bamboo-like copper crystal particles is also disclosed.

4 Claims, 4 Drawing Sheets

(56) References Cited

U.S. PATENT DOCUMENTS

2014/0299476 A1* 10/2014 Yasuda ............. H01L 21/76877
205/131
2015/0368819 A1* 12/2015 Zhang ...................... C25D 3/56
205/239

FOREIGN PATENT DOCUMENTS

| CN | 102953097 A | 3/2013 |
| CN | 105026385 A | 11/2015 |

* cited by examiner

A  B

A  B

COPPER CRYSTAL PARTICLES HAVING A HIGHLY PREFERRED ORIENTATION AND A PREPARATION METHOD THEREOF

The present invention is the national stage application of PCT/CN2017/103498, filed on Sep. 26, 2017, which claims priority to Chinese Patent Application No. 201611037367.6, filed on Nov. 23, 2016, which is incorporated by reference for all purposes as if fully set forth herein.

FIELD OF THE INVENTION

The present invention relates to the field of electroplating, and more particularly to copper crystal particles having a highly preferred orientation and a method of preparing the same by direct current plating.

BACKGROUND OF THE INVENTION

Copper with highly preferred orientation has many excellent properties. Because copper crystal particles have highly preferred orientation, their properties are different in different orientations. For a microscopic point of view, different crystal orientations lead different atomic arrangements and densities, resulting in different thermodynamic and electromagnetic properties. In addition, from the chemical reactivity point of view, different crystal orientations lead to different reaction rate. For example, etching rates in different orientations of the crystal particles can be different. This is extremely beneficial for differential etching. There is no need to protect the copper surface (e.g., dry film protection, tin protection) for selective etching. At the same time, "side erosion" and "pool" effects can also be avoided.

Copper with highly preferred orientation, however, cannot be easily obtained, especially in the field of microelectronics. Currently, a relatively feasible method is electroplating, but this method requires pulse electrodeposition. The equipment requirements for pulse electrodeposition are extremely high. The current density for pulse electrodeposition is relatively low, usually less than 5 A/dm$^2$, which results in low production efficiency. In addition, pulse electrodeposition cannot control the degree of preferred orientation to obtain copper crystal particles with preferred orientation.

There is a need for a convenient and efficient method for preparing copper crystal particles having a highly preferred orientation.

SUMMARY OF THE INVENTION

In one embodiment, the present invention provides a method of preparing bamboo-like copper crystal particles having a highly preferred orientation. The method includes providing a substrate; conducting a direct current copper electroplating on the substrate in a copper plating solution at a plating current density of 3 to 30 A/dm$^2$; and depositing the copper crystal particles on the substrate. The copper plating solution includes copper plating additives and a copper plating base solution; the copper base solution includes copper sulfate, sulfuric acid, and a trace amount of hydrochloric acid or sodium chloride, and the copper base solution has a concentration of copper ions of 40-60 g/L, a concentration of sulfate ions of 80-120 g/L, and a concentration of chloride ions of 40-60 ppm; and the copper plating additives include an accelerator, a suppressor, and a non-dye leveler, the accelerator has a concentration of 3 to 5 mL/L, the suppressor has a concentration of 5 to 15 mL/L, and the non-dye leveler has a concentration of 25 to 35 mL/L.

In another embodiment, the non-dye leveler is a quaternary ammonium salt having formula (I):

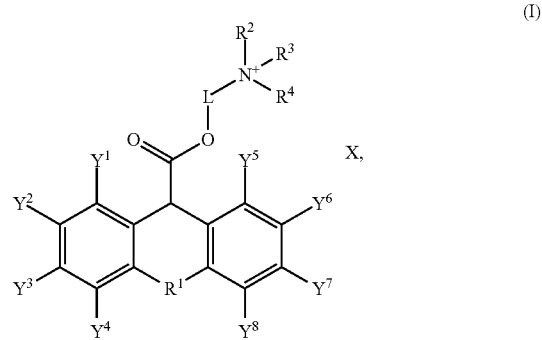

in formula (I), X is Cl$^-$, or Br$^-$; R$^1$ is O, S or N; R$^2$, R$^3$ and R$^4$ are independently selected from the group consisting of hydrogen, unsubstituted or substituted alkyl, unsubstituted or substituted alkenyl, unsubstituted or substituted alkynyl, unsubstituted or substituted C$_{3-12}$cycloalkyl, unsubstituted or substituted C$_{6-12}$ aryl, unsubstituted or substituted 3-12 membered heterocyclic, and unsubstituted or substituted 5-12 membered heteroaryl; or R$^2$ and R$^3$ may combine with an atom or atoms to which they are attached to form unsubstituted or substituted C$_{3-12}$cycloalkyl, unsubstituted or substituted 3- to 12-membered heterocyclic, unsubstituted or substituted C$_{6-12}$ aryl, or unsubstituted or substituted 5- to 12-membered heteroaryl; Y$^1$, Y$^2$, Y$^3$, Y$^4$, Y$^5$, Y$^6$, Y$^7$, and Y$^8$ are independently selected from the group consisting of hydrogen, halogen, unsubstituted or substituted alkyl, unsubstituted or substituted alkenyl, unsubstituted or substituted alkynyl, unsubstituted or substituted C$_{3-12}$ cycloalkyl, unsubstituted or substituted C$_{6-12}$ aryl, unsubstituted or substituted 3-12 membered heterocyclic, and unsubstituted or substituted 5-12 membered heteroaryl; and L is selected from the group consisting of unsubstituted or substituted alkyl, unsubstituted or substituted C$_{6-12}$ aryl, and unsubstituted or substituted 3- to 12-membered heterocyclyl.

In another embodiment, the non-dye leveler is

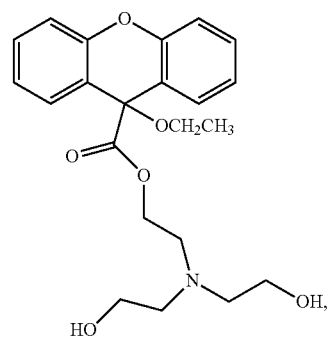

-continued

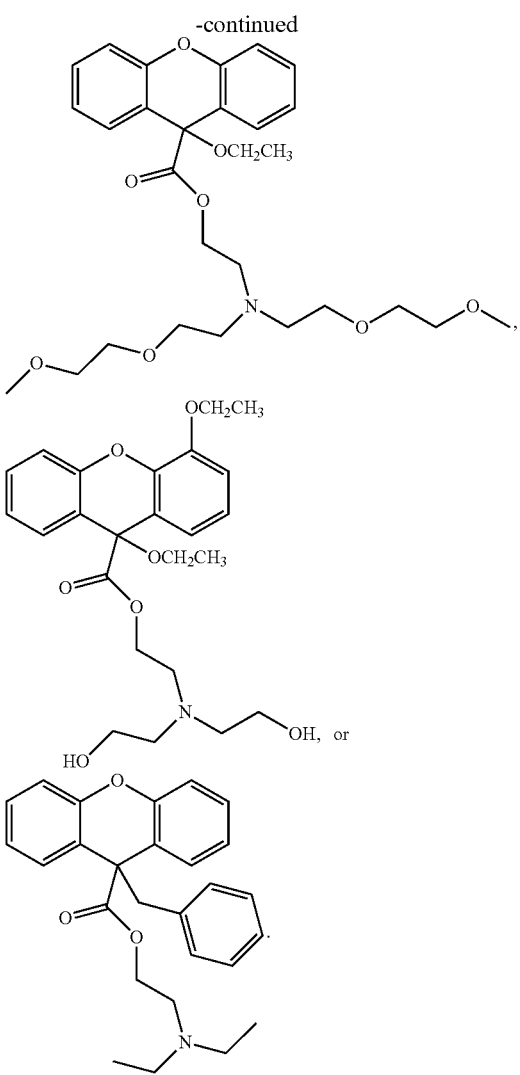

In another embodiment, the accelerator is an organosulfate having formula (II):

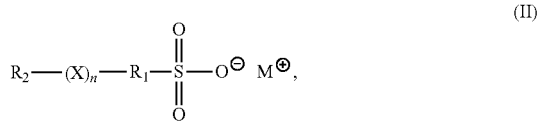

in formula (II), X is O or S; n is 1 to 6; M is hydrogen, alkali metal, or ammonium; $R_1$ is an alkylene, cyclic alkylene group of 1 to 8 carbon atoms, or an aromatic hydrocarbon of 6 to 12 carbon atoms; and $R_2$ is $MO_3SR_1$.

In another embodiment, the organosulfate is sodium lauryl sulfate, disodium 3,3-dithiobispropane-sulphonate, or 3,3'-dithiobispropanesulfonic acid.

In another embodiment, the suppressor is polyethylene glycol, 2-mercaptoethanol, polypropylene ether, or poly N,N'-diethylsaphranin.

In one embodiment, the present invention provides an electroplating copper layer. The electroplating copper layer includes bamboo-like copper crystal particles having a highly preferred orientation. The bamboo-like copper crystal particles have a long axis direction and a short axis direction, and the bamboo-like copper crystal particles have a length of 20 nm to 5 μm in the long axis direction and a length of 20 nm to 2 μm in the short axis direction.

In another embodiment, a first plurality of the bamboo-like copper crystal particles have a preferred orientation, and the preferred orientation is a direction perpendicular to a copper substrate on which the electroplating copper layer is deposited.

In another embodiment, a second plurality of the bamboo-like copper crystal particles have a second orientation, the second orientation and the preferred orientation forms an angle of great than 0° and less than 45°, and the second plurality of the bamboo-like copper crystal particles constitutes 50-90% of all the bamboo-like copper crystal particles.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
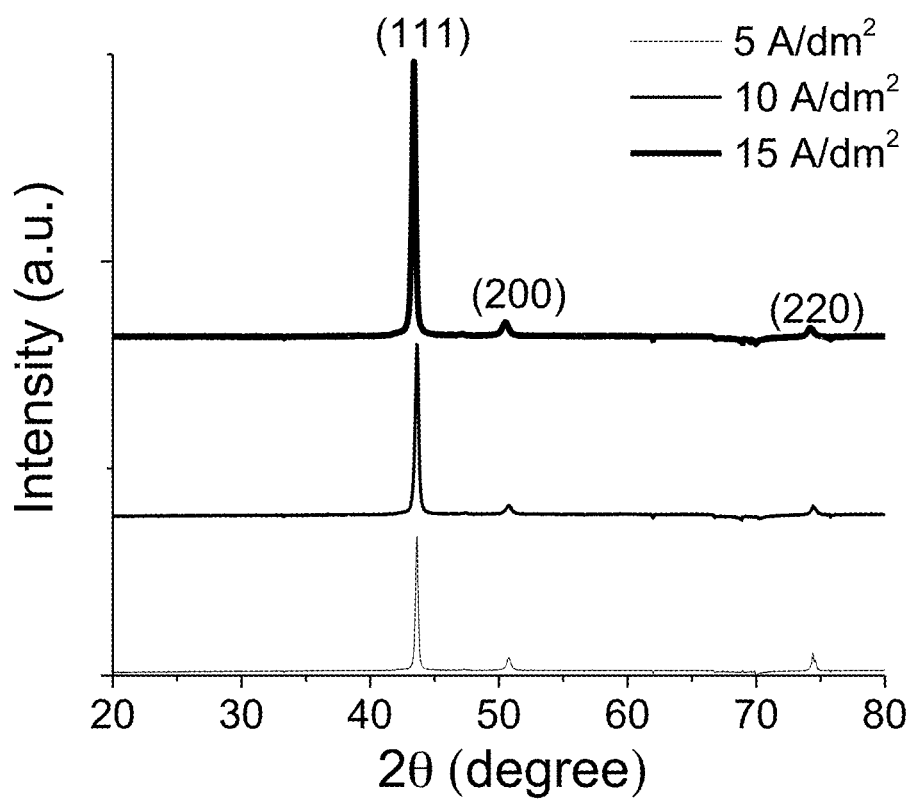
FIG. 1 is an XRD (X-ray diffraction) pattern of the copper layer of Example 1 of the present invention.

Reference will now be made in detail to embodiments of the present invention, example of which is illustrated in the accompanying drawings.

The present invention provides a method for preparing copper crystal particles having a highly preferred orientation. The method does not require pulse electrodeposition, and can be used at a high current density.

Specifically, this method uses a direct current electroplating process, and the current density for electroplating is 3-30 A/dm². The method uses a copper plating solution that includes copper plating additives and a copper plating base solution.

The copper base solution includes copper sulfate, sulfuric acid, and a trace amount of hydrochloric acid or sodium chloride. The concentration of copper ions in the copper plating base solution is 40-60 g/L, the concentration of sulfate ions is 80-120 g/L, and the concentration of chloride ions is 40-60 ppm.

The copper plating additives include an accelerator, a suppressor, and a non-dye leveler. The concentration of the accelerator in the copper plating solution is 3 to 5 mL/L, the concentration of the suppressor is 5 to 15 mL/L, and the concentration of the non-dye leveler is 25 to 35 mL/L.

Preferably, the accelerator is an organosulfate, the suppressor is polyethylene glycol, and the non-dye leveler is a quaternary ammonium salt.

Preferably, the suppressor is polyethylene glycol, 2-mercaptoethanol, polypropylene ether, or poly N,N'-diethylsaphranin.

Preferably, the quaternary ammonium salt has the following formula (I):

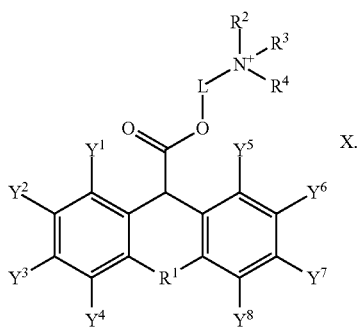

(I)

In formula (I), X is Cl$^-$, or Br$^-$; R$^1$ is O, S or N; R$^2$, R$^3$ and R$^4$ are independently selected from the group consisting of hydrogen, unsubstituted or substituted alkyl, unsubstituted or substituted alkenyl, unsubstituted or substituted alkynyl, unsubstituted or substituted C$_{3-12}$cycloalkyl, unsubstituted or substituted C$_{6-12}$ aryl, unsubstituted or substituted 3-12 membered heterocyclic, and unsubstituted or substituted 5-12 membered heteroaryl; or R$^2$ and R$^3$ may combine with an atom or atoms to which they are attached to form unsubstituted or substituted C$_{3-12}$cycloalkyl, unsubstituted or substituted 3- to 12-membered heterocyclic, unsubstituted or substituted C$_{6-12}$ aryl, or unsubstituted or substituted 5- to 12-membered heteroaryl; Y$^1$, Y$^2$, Y$^3$, Y$^4$, Y$^5$, Y$^6$, Y$^7$, and Y$^8$ are independently selected from the group consisting of hydrogen, halogen, unsubstituted or substituted alkyl, unsubstituted or substituted alkenyl, unsubstituted or substituted alkynyl, unsubstituted or substituted C$_{3-12}$cycloalkyl, unsubstituted or substituted C$_{6-12}$ aryl, unsubstituted or substituted 3-12 membered heterocyclic, and unsubstituted or substituted 5-12 membered heteroaryl; and L is selected from the group consisting of unsubstituted or substituted alkyl, unsubstituted or substituted C$_{6-12}$ aryl, and unsubstituted or substituted 3- to 12-membered heterocyclyl.

Preferably, R$^1$ in formula (I) is O.
Preferably, Y$^1$, Y$^2$, Y$^3$, Y$^4$, Y$^5$, Y$^6$, Y$^7$, and Y$^8$ in formula (I) are hydrogen.
Preferably, R$^2$, R$^3$ and R$^4$ in formula (I) are each independently C$_{1-6}$alkyl.
Preferably, R$^2$ in formula (I) is methyl, and R$^3$ and R$^4$ in formula (I) are isopropyl.
Preferably, R$^2$ and R$^3$ in formula (I) are ethyl, and R$^4$ in formula (I) is benzyl.

Preferably, the organosulfate has formula (II):

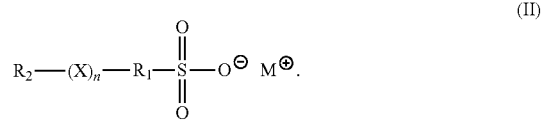

(II)

In formula (II), X is O or S; n is 1 to 6; M is hydrogen, alkali metal, or ammonium; R$_1$ is an alkylene, cyclic alkylene group of 1 to 8 carbon atoms, or an aromatic hydrocarbon of 6 to 12 carbon atoms; and R$_2$ is MO$_3$SR$_1$.

Preferably, X in formula (II) is S.
Preferably, the organosulfate has formula (III):

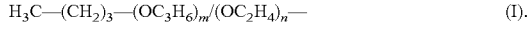

(I).

In formula (III), n is between 1 and about 200 and m is between 1 and about 200.

Preferably, the organosulfate is sodium lauryl sulfate, disodium 3,3-dithiobispropane-sulphonate, or 3, 3'-dithiobispropanesulfonic acid.

The present invention also provides copper crystal particles having a highly preferred orientation obtained by the above-mentioned method. The copper crystal particles are column-shaped crystal particles having a long axis direction and a short axis direction. The copper crystal particles have a length of 20 nm to 5 μm in the long axis direction and a length of 20 nm to 2 μm in the short axis direction.

The microstructure of the copper crystal particles indicates that the particles have a highly preferred orientation. Specifically, the highly preferred orientation is a direction that is perpendicular to the surface of the plating substrate, i.e., a vertical direction. Not all the copper crystal particles have the highly preferred orientation, i.e., a long axis direction that is parallel to this vertical direction.

Some particles may have other orientations, that is, the degree of orientation. The degree of orientation depends on two factors. First is an angle formed by the long axis direction of a copper crystal particle and the vertical direction. The angle is from great than 0° and less than 45°. When the angle is 0°, the long axis direction of a copper crystal particle is parallel to the vertical direction. Second is the percentage of copper crystal particles having an angle from great than 0° and less than 45° in all the copper crystal particles. The percentage is 50 to 90%.

Further, the copper crystal particles can have different orientations when subjected to an annealing process. The temperature for the annealing process can be 60 to 300° C., and the annealing time can be 10 to 300 minutes.

The present invention has the following advantages.

The present invention uses a copper sulfate-sulfuric acid system as the copper plating base solution and a certain amount of copper plating additives. The preparation method uses a direct current electroplating process and realizes high-speeding plating using regular direct current electroplating equipment. The method also realizes a highly preferred orientation for the copper crystal particles in the in the microstructure of the coating layer and that the degree of orientation can be controlled.

Compared with conventional technology, first, the present invention uses a regular direct current electroplating process and reduces the complexity of obtaining copper crystal particles having a highly preferred orientation via a convention method. Second, the present invention does not require complicated pulse rectification equipment in production, and thus significantly reduces the production cost. Third, the optimization of the electroplating process and the annealing condition can realize the control of the preferred orientation and achieve the anisotropy of the coating layer. Last, the addition of copper plating additives increases the capacity for current density in the electroplating process, realizes high speed plating, and significantly improves production efficiency.

The above description is merely an overview of the technical solution of the present invention, and the technical means of the present invention can be understood more clearly and can be carried out in accordance with the contents of the specification.

EXAMPLE 1

Copper plating additives were added to a copper plating base solution to obtain a copper plating solution. The copper plating base solution included copper sulfate, sulfuric acid, and a trace amount of hydrochloric acid. In the copper plating solution, the concentrations of an accelerator, a suppressor, and non-dye leveler were 3-5 mL/L, 5-15 mL/L, and 25-35 mL/L, respectively. The concentration of copper ions is 40-60 g/L, the concentration of sulfate ions is 80-120 g/L, and the concentration of chloride ions is 40-60 ppm. The copper plating solution was stirred for 1.5-2.5 hours to mix well.

The accelerator is sodium lauryl sulfate, disodium 3,3-dithiobispropane-sulphonate, or 3, 3'-dithiobispropanesulfonic acid.

The non-dye leveler is

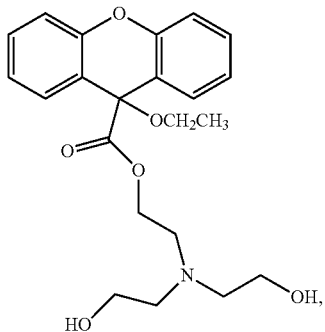

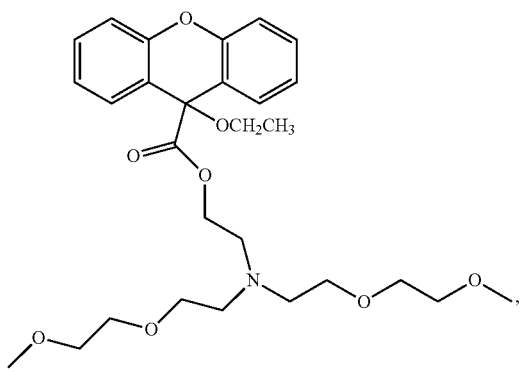

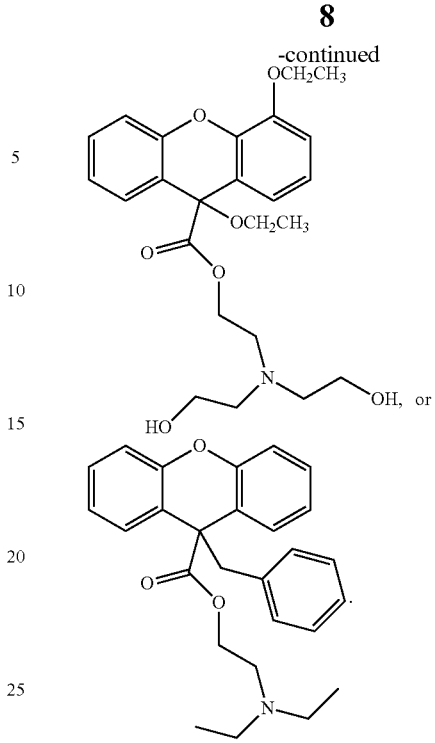

Substrates were electroplated at three different direct current densities, 5 A/dm$^2$, 10 A/dm$^2$ and 15 A/dm$^2$, for 15 min, 7.5 min, and 5 min, respectively, using the copper plating solution prepared above.

Plating conditions are as follows:
a. Cu$^{2+}$ from copper sulfate (50 g/L, Cu$^{2+}$)
b. Sulfuric acid (100 g/L)
c. Chloride ion (50 ppm)
d. Suppressor S24 (10 mL/L), leveler L118 (30 mL/L), accelerator A28 (4 mL/L)
e. Plating CD: 10 ASD
f. Target height: 10 μm The XRD patterns of the copper coated substrates prepared at three different current densities were measured by X-ray diffractometry and are shown in FIG. 1.

Figure 2:
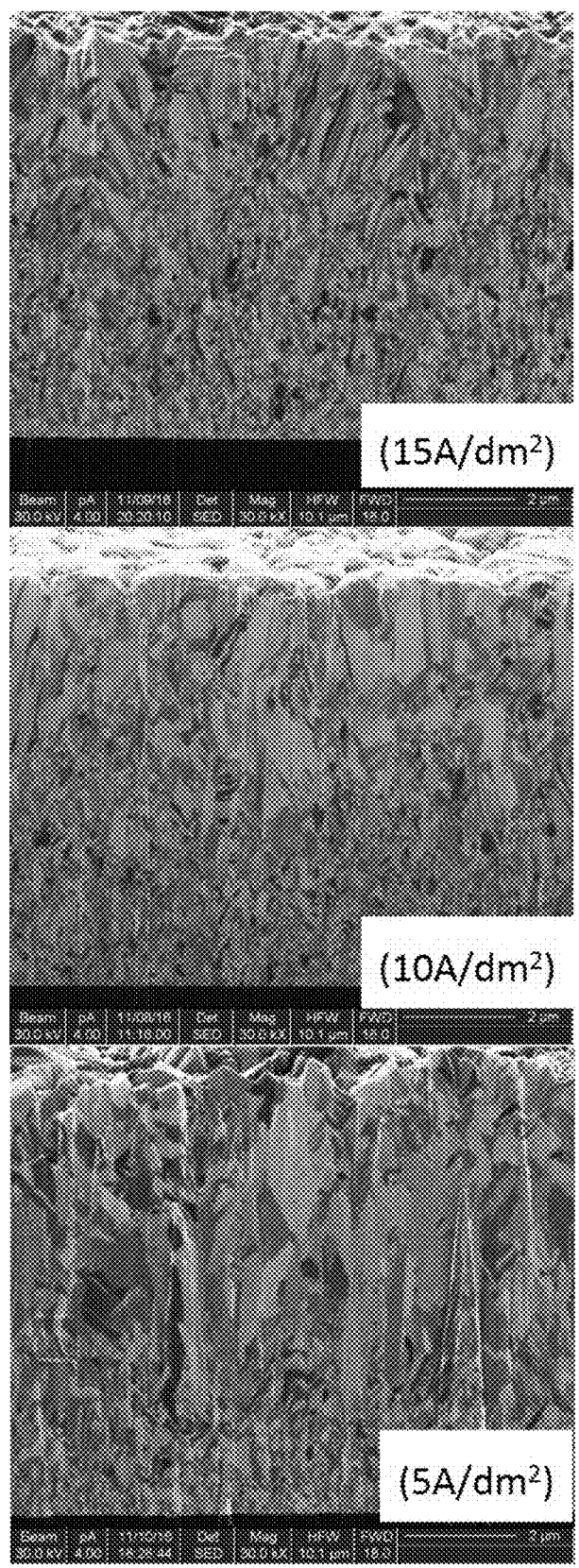
FIG. 2 shows cross-sectional microstructure pictures by FIB (focused ion beam) of the copper layer of Example 1 of the present invention.

The cross-sectional microstructure pictures of the copper coated substrates prepared at three different direct current densities were measured by FIB and are shown in FIG. 2.

The results show that the inventive electroplating copper is obtained at under high plating speed (i.e., 10 ASD) and has bamboo-like structure and uniform particle size.

EXAMPLE 2

Copper plating additives were added to a copper plating base solution to obtain a copper plating solution. The copper plating base solution included copper sulfate, sulfuric acid, and a trace amount of sodium chloride. In the copper plating solution, the concentrations of an accelerator, a suppressor, and non-dye leveler were 3-5 mL/L, 5-15 mL/L, and 25-35 mL/L, respectively. The concentration of copper ions is 40-60 g/L, the concentration of sulfate ions is 80-120 g/L, and the concentration of chloride ions is 50 ppm. The copper plating solution was stirred for 1.5-2.5 hours to mix well.

Two substrates can be electroplated at 5-15 A/dm$^2$ for 5-15 min using the copper plating solution prepared above. One copper coated substrate were then placed in a nitrogen-protected annealing furnace and annealed at 200-300° C. for 0.5-2 h.

Figure 3:
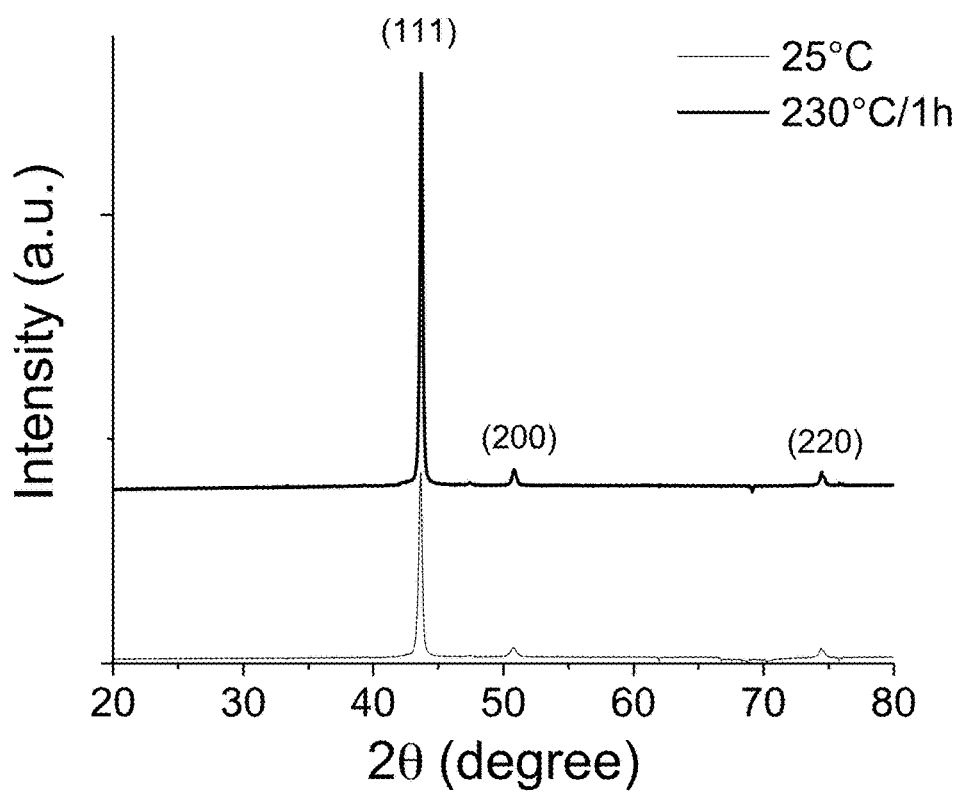
FIG. 3 shows a XRD (X-ray diffraction) pattern of the copper layer of Example 2 of the present invention.

The XRD patterns of the copper coated substrates of the annealed substrate and unannealed substrate were measured by X-ray diffractometry and are shown in FIG. 3.

Figure 4:
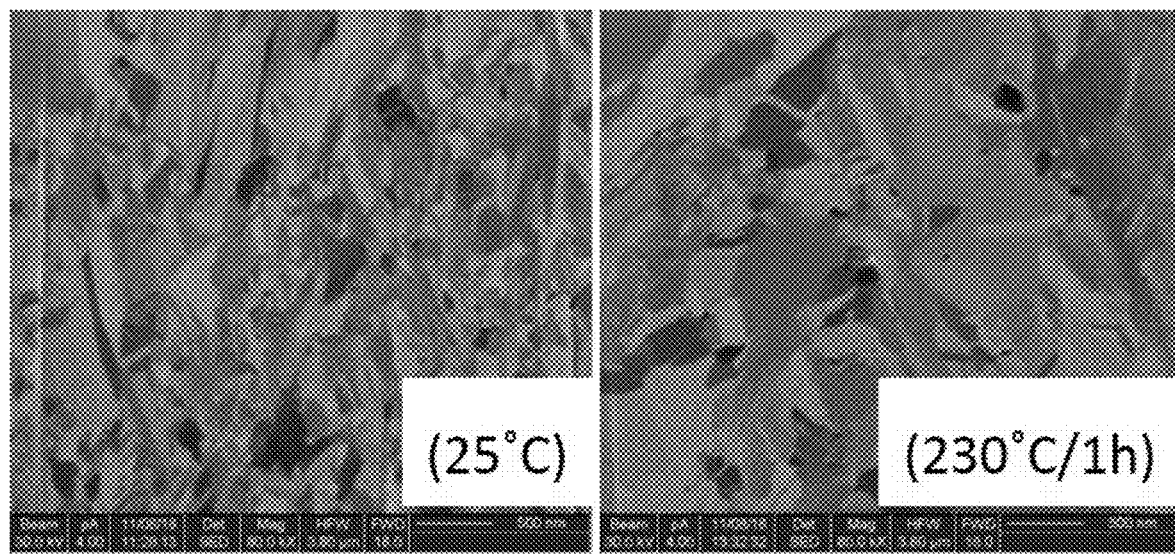
FIG. 4 shows cross-sectional microstructure pictures by FIB (focused ion beam) of the copper layer of Example 2 of the present invention.

The cross-sectional microstructure pictures of the annealed substrate and unannealed substrate were measured by FIB and are shown in FIG. 4.

The results show that the inventive electroplating copper is obtained at under high plating speed (i.e., 10 ASD) and has bamboo-like structure and uniform particle size.

EXAMPLE 3

Figure 5:
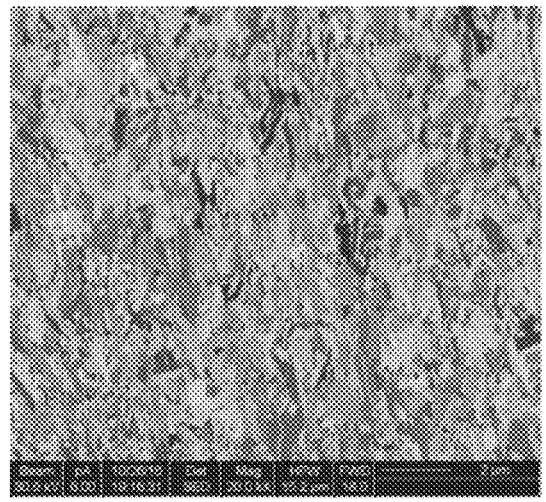
FIG. 5A shows a cross-sectional microstructure (SEM, Mag. ×5,000) of the electroplating copper of Example 3 of the present invention.
FIG. 5B shows a cross-sectional microstructure (FIB) of the electroplating copper of Example 3 of the present invention.
Figure 5:
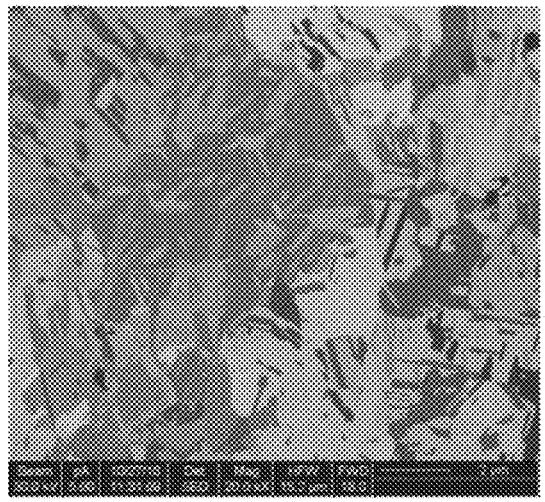

An inventive electroplating copper was obtained with the same plating conditions described in Examples 1 and 2. A cross-sectional microstructure (SEM, Mag. ×5,000) of the inventive electroplating copper is shown in FIG. 5A. As shown in FIG. 5A, the inventive electroplating copper has bamboo-like structure.

Figure 6:
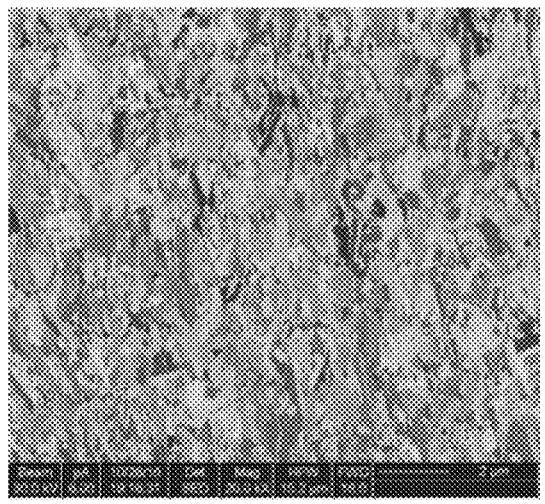
FIG. 6A shows a cross-sectional microstructure (SEM, Mag. ×5,000) of the electroplating copper of Comparative Example 1 of the present invention.
FIG. 6B shows a cross-sectional microstructure (FIB) of the electroplating copper of Comparative Example 1 of the present invention.
Figure 6:
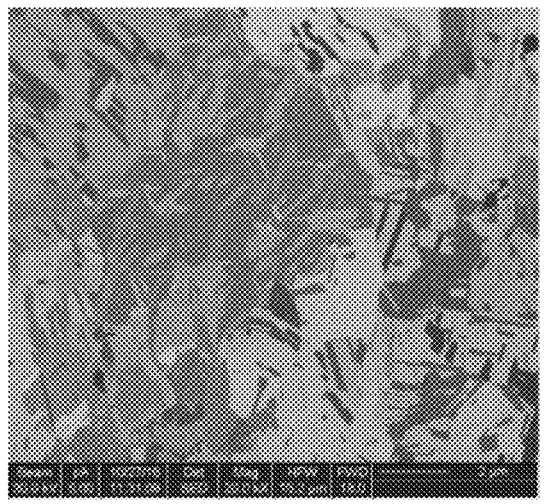

A cross-sectional microstructure (FIB) of the inventive electroplating copper is shown in FIG. 6A. As shown in FIG. 6A, the inventive electroplating copper is obtained at under high plating speed (i.e., 10 ASD) has bamboo-like structure and uniform particle size.

COMPARATIVE EXAMPLE 1

A conventional electroplating copper was obtained with the following BKM plating conditions:
a. $Cu^{2+}$ from copper sulfate (50 g/L, $Cu^{2+}$)
b. Sulfuric acid (100 g/L)
c. Chloride ion (50 ppm)
d. Additive A (Enthone Inc.) (12 mL/L), Additive B (Enthone Inc.) (6 m L/L)
e. Plating CD: 10 ASD
f. Target height: 10 μm A cross-sectional microstructure (SEM, Mag. ×5,000) of the conventional electroplating copper is shown in FIG. 5B. As shown in FIG. 5B, the conventional electroplating copper is non-oriented.

A cross-sectional microstructure (FIB) of the inventive electroplating copper is shown in FIG. 6B. As shown in FIG. 6B, the conventional electroplating copper is non-oriented and has a large size distribution.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of preparing bamboo-like copper crystal particles having a highly preferred orientation comprising:
providing a substrate;
conducting a direct current copper electroplating on the substrate in a copper plating solution at a plating current density of 3 to 30 A / $dm^2$; and
depositing the copper crystal particles on the substrate,
wherein the copper plating solution includes copper plating additives and a copper plating base solution;
wherein the copper base solution includes copper sulfate, sulfuric acid, and a trace amount of hydrochloric acid or sodium chloride, and the copper base solution has a concentration of copper ions of 40-60 g/L, a concentration of sulfate ions of 80-120 g/L, and a concentration of chloride ions of 40-60 ppm;
wherein the copper plating additives include an accelerator, a suppressor, and a non-dye leveler, the accelerator has a concentration of 3 to 5 mL / L, the suppressor has a concentration of 5 to 15 mL / L, and the non-dye leveler has a concentration of 25 to 35 mL/L; and
wherein the non-dye leveler is

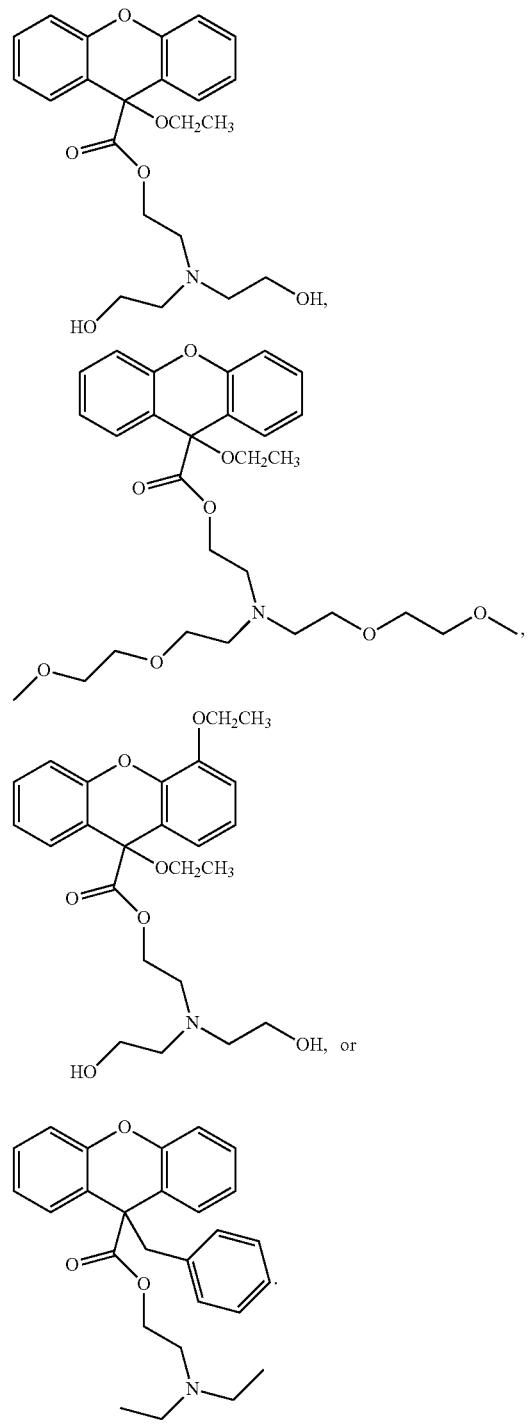

2. The method of claim 1, wherein the accelerator is sodium lauryl sulfate or an organosulfate having formula (II):

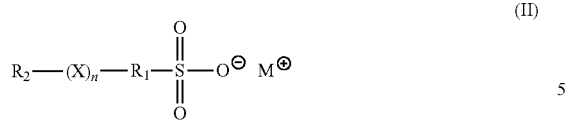
(II)

in formula (II), X is O or S; n is 1 to 6; M is hydrogen, alkali metal, or ammonium; $R_1$ is an alkylene, cyclic alkylene group of 1 to 8 carbon atoms, or an aromatic hydrocarbon of 6 to 12 carbon atoms; and $R_2$ is $MO_3SR_1$.

3. The method of claim 2, wherein the organosulfate having formula (II) is disodium 3,3-dithiobispropane-sulphonate or 3, 3'-dithiobispropanesulfonic acid.

4. The method of claim 1, wherein the suppressor is polyethylene glycol, 2-mercaptoethanol, polypropylene ether, or poly N,N'-diethylsaphranin.

* * * * *